United States Patent [19]
Weiss et al.

[11] Patent Number: 5,281,814
[45] Date of Patent: Jan. 25, 1994

[54] SYSTEM FOR IMAGING AND DETECTING THRESHOLD PHENOMENA ASSOCIATED WITH AND/OR ATOMIC OR MOLECULAR SPECTRA OF A SUBSTANCE BY REFLECTION OF AN AC ELECTRICAL SIGNAL

[75] Inventors: Paul S. Weiss; Stephan J. Stranick, both of State College, Pa.

[73] Assignee: The Penn State Research Foundation, Penn State Rsrch Foundtn & Biotechnol. Rsch. & Dev. Corp., University Park, Pa.

[21] Appl. No.: 979,597

[22] Filed: Nov. 20, 1992

Related U.S. Application Data

[63] Continuation-in-part of Ser. No. 916,165, Jul. 17, 1992.

[51] Int. Cl.$^5$ .............................. H01J 37/28
[52] U.S. Cl. ..................... 250/306; 250/307; 204/153.1; 204/400; 204/412
[58] Field of Search ................. 250/306, 307; 204/153.1, 400, 412

[56] References Cited

PUBLICATIONS

G. Kochanski, "Nonlinear Alternating-Current Tunneling Microscopy", (AT&T Preprint (Aug. 17, 1988), published in *Physical Review Letters*, 62 (19):2285-2288 (May 8, 1989).
W. Seifert et al., "Scanning Tunneling Microscopy At Microwave Frequencies," *Ultramicroscopy* 42-44; 379-387 (1992).
W. Seifert et al., "Scanning Tunneling Microscopy at Microwave Frequencies," Korrigierte Version (Nov. 6, 1991) published in *Ultramicroscopy* 42-44; 379-387 (1992).
D. Anselmetti et al., H.-J. Güntherodt R. Weisendanger (Eds.) "Scanning Tunneling Microscopy I," pp. 5-6.
L. Arnold et al., "Laser-Frequency Mixing Using the Scanning Tunneling Microscope," *J. Vac. Sci. Technol.*, A, 6(2): 466-469 (Mar./Apr. 1988).
L. Arnold et al., "Laser-Frequency Mixing in the Junction of a Scanning Tunneling Microscope," *Appl. Phys. Lett.*, 51(11):786-788 (Sep. 14, 1987).
M. Völcker et al., "Laser-Driven Scanning Tunneling Microscope," *Phys. Rev. Lett.*, 66(13):1717-1720 (Apr. 1, 1991).
D. Cahill et al., "Scanning Tunneling Microscopy of Photoexcited Carriers at the Si(001) Surface," *J. Vac. Sci. Technol.*, B, 9(2):564-567 (Mar./Apr. 1991).
R. Hamers et al., "Atomically Resolved Carrier Recombination at Si (111)-(7×7) Surfaces," *Phys. Rev. Lett.*, 64(9):1051-1054 (Feb. 26, 1990).
Y. Kuk et al., "Optical Interactions in the Junction of a Scanning Tunneling Microscope," published in *Phys. Rev. Lett.*, 65(4):456-459 (1990).
K. Likharev, "Correlated Discrete Transfer of Single Electrons In Ultrasmall Tunnel Junctions," *IBM J. Res. Develop.*, 32(1):144-158 (Jan. 1988).

(List continued on next page.)

*Primary Examiner*—Jack I. Berman
*Attorney, Agent, or Firm*—Majestic, Parsons, Siebert & Hsue

[57] ABSTRACT

A microwave sweep oscillator is used to apply an AC signal from the probe tip of a scanning tunneling microscope to a sample, and the reflected signal from the sample is measured by a microwave spectrum/network analyzer, or another device capable of measuring amplitude versus frequency. The frequency of the signal applied by the oscillator may be swept across a spectrum and the optimum frequency of the spectrum is determined so that an improved image of the surface of a sample may be obtained. The spectrum of a known substance may also be recorded and used as a signature for identifying components of an unknown substance by comparison. When the amplitude of the AC signal applied is increased, a sudden change in the response indicates a threshold. By reducing the frequency, the response will indicate charge dissipation characteristics of the sample. When applied to electrochemical cells, this invention is particularly useful for measuring dynamic information of the electrochemical cell.

27 Claims, 10 Drawing Sheets

PUBLICATIONS

K. Likharev et al., "Single Electronics," *Scientific American*, Jun. 1992.

C. Andrieux et al., "Ultramicroelectrodes: Cyclic Voltammetry Above One Million V s$^1$", *J. Electroanal. Chem.*, 248:447–450 (1988).

R. Wightman et al., "High-Speed Cyclic Voltammetry," *Acc. Chem. Res.*, 23:64–70 (1990).

"Near-Field Optics: Microscopy, Spectroscopy, and Surface Modification Beyond the Diffraction Limit," by Betzig et al., *Science*, vol. 257, pp. 189–195, Jul. 1992.

"Breaking the Diffraction Barrier: Optical Microscopy on a Nanometric Scale," by Betzig et al., *Science*, vol. 251, pp. 1468–1470, Nov. 30, 1990.

"Scanning Surface Harmonic Microscopy: Scanning Probe Microscopy Based on Microwave Field-Induced Harmonic Generation," by Michel et al., *Rev. Sci. Instrum.*, 63(9):4080–4085, Sep. 1992.

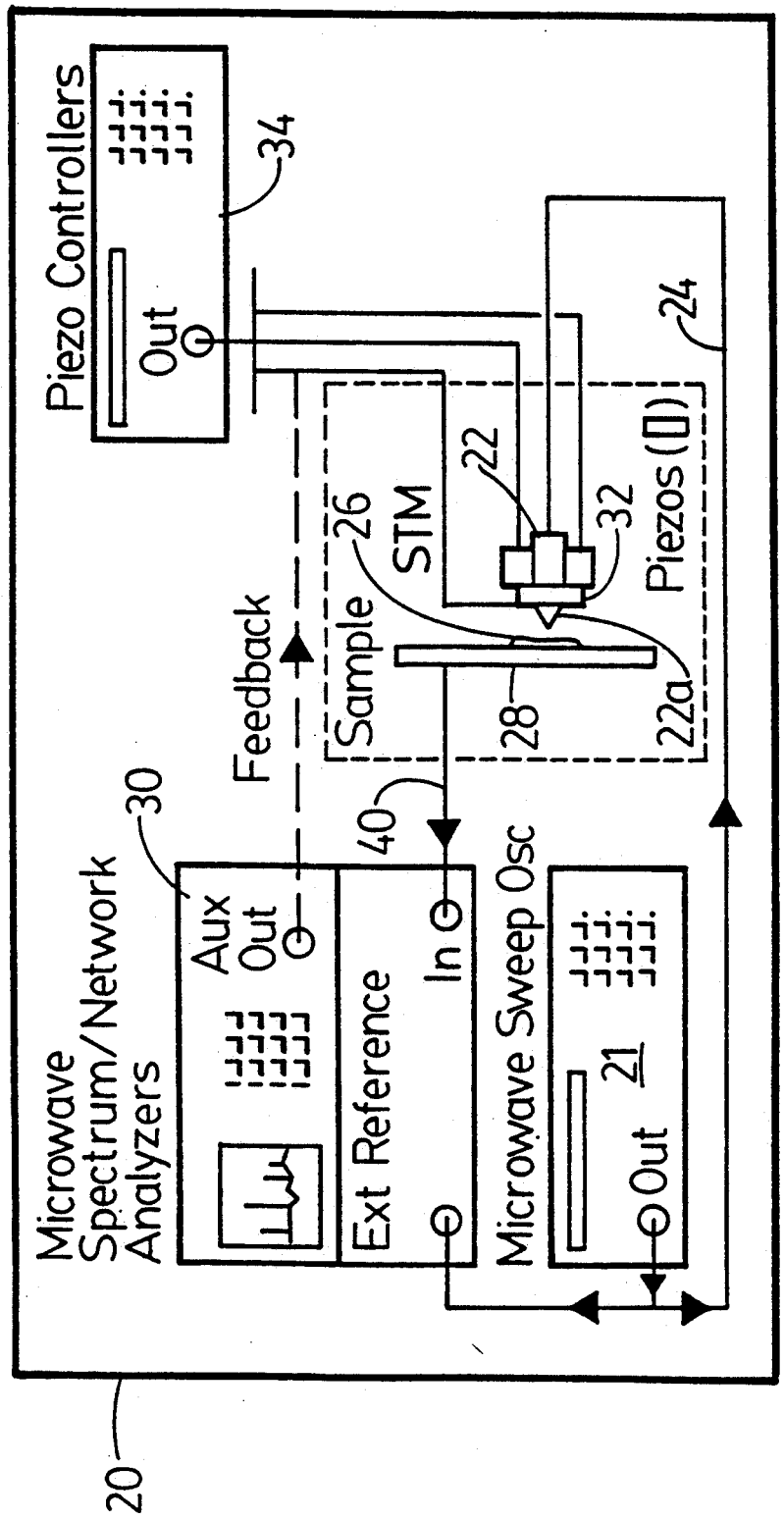
FIG._1.

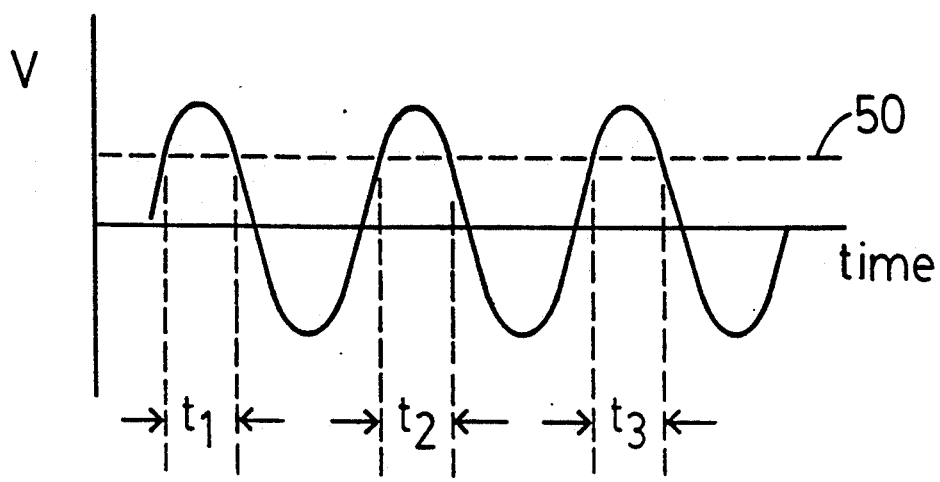
FIG._2A.
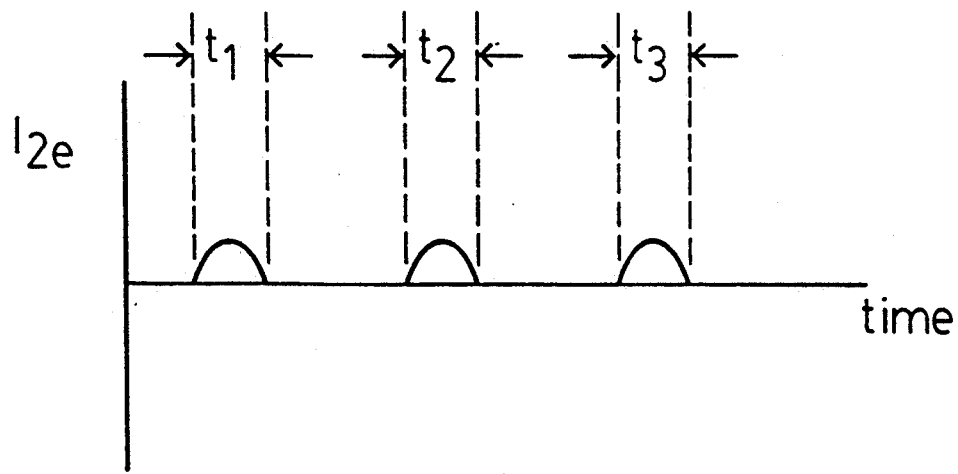
FIG._2B.

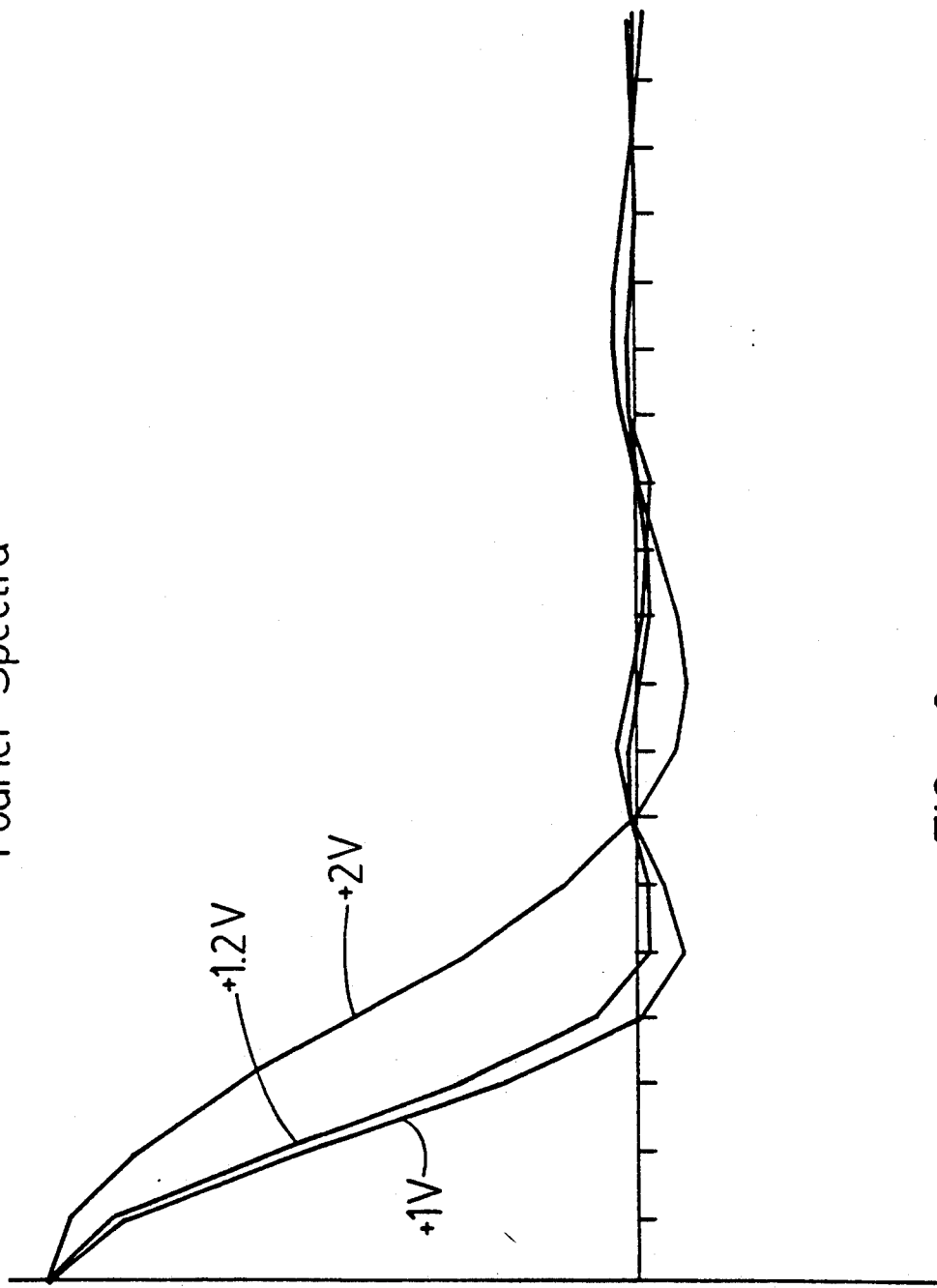
FIG._3.

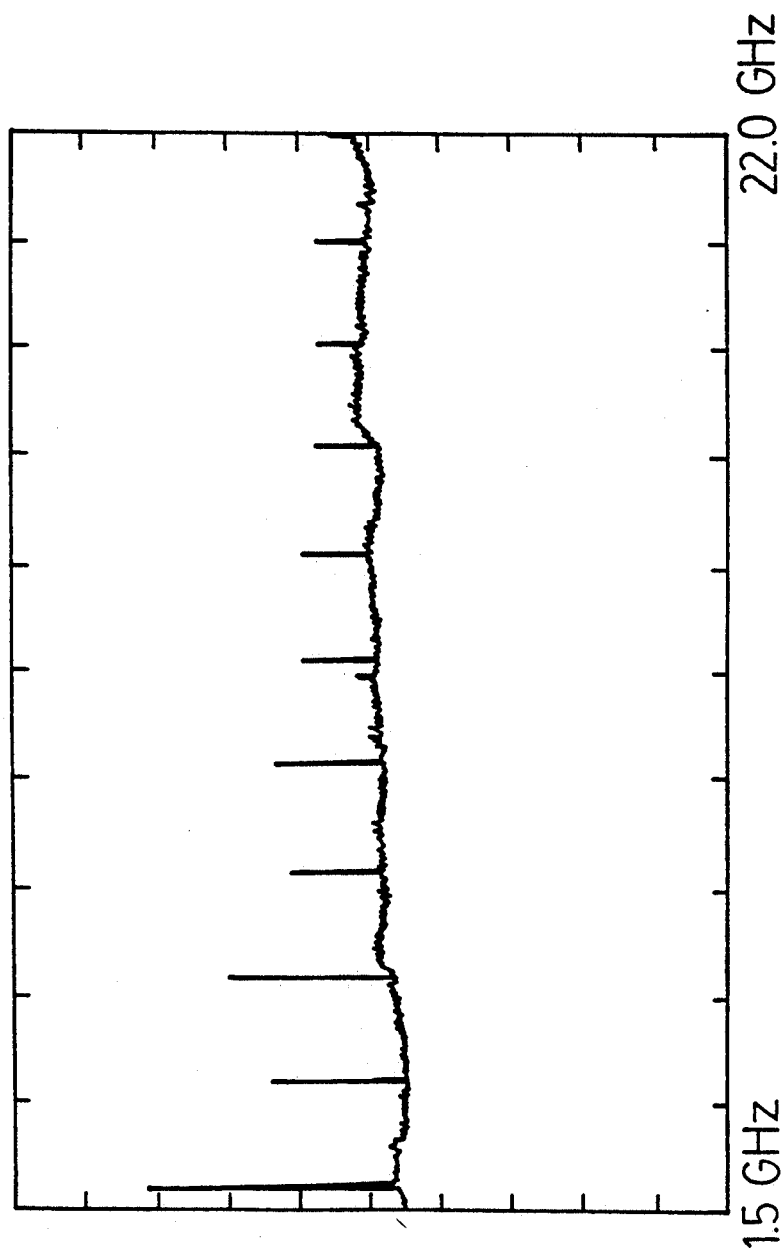
FIG._4.

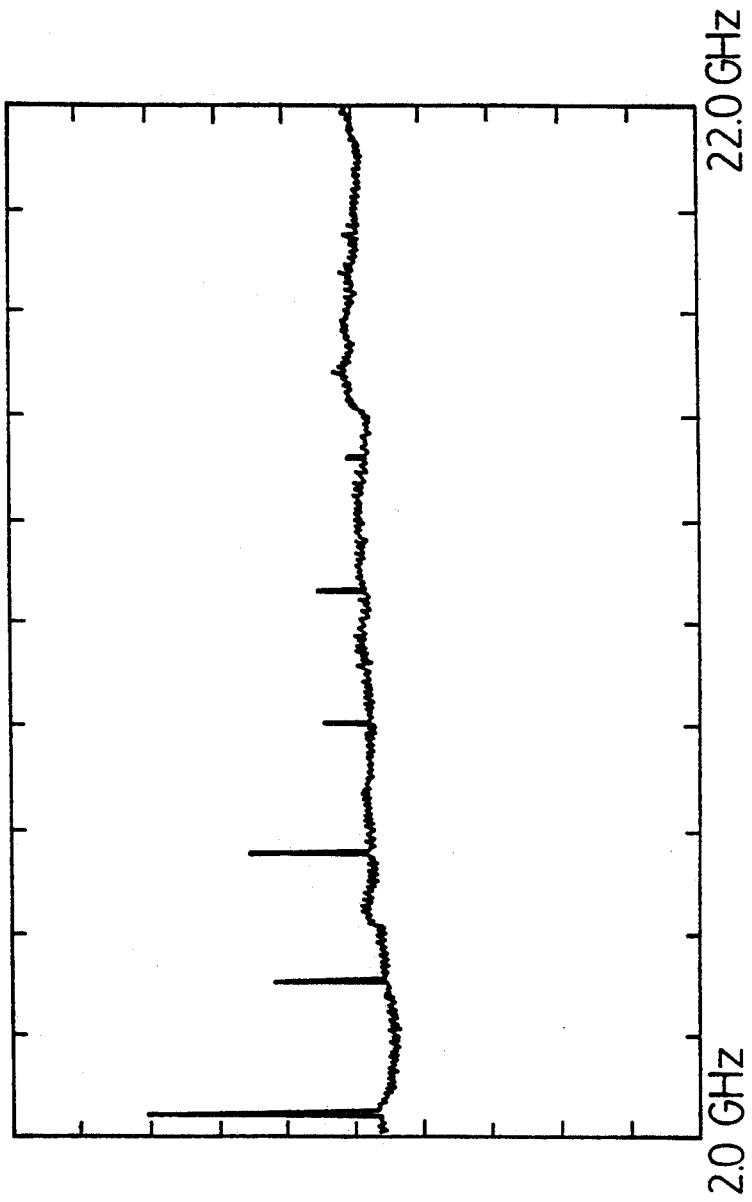
FIG._5.

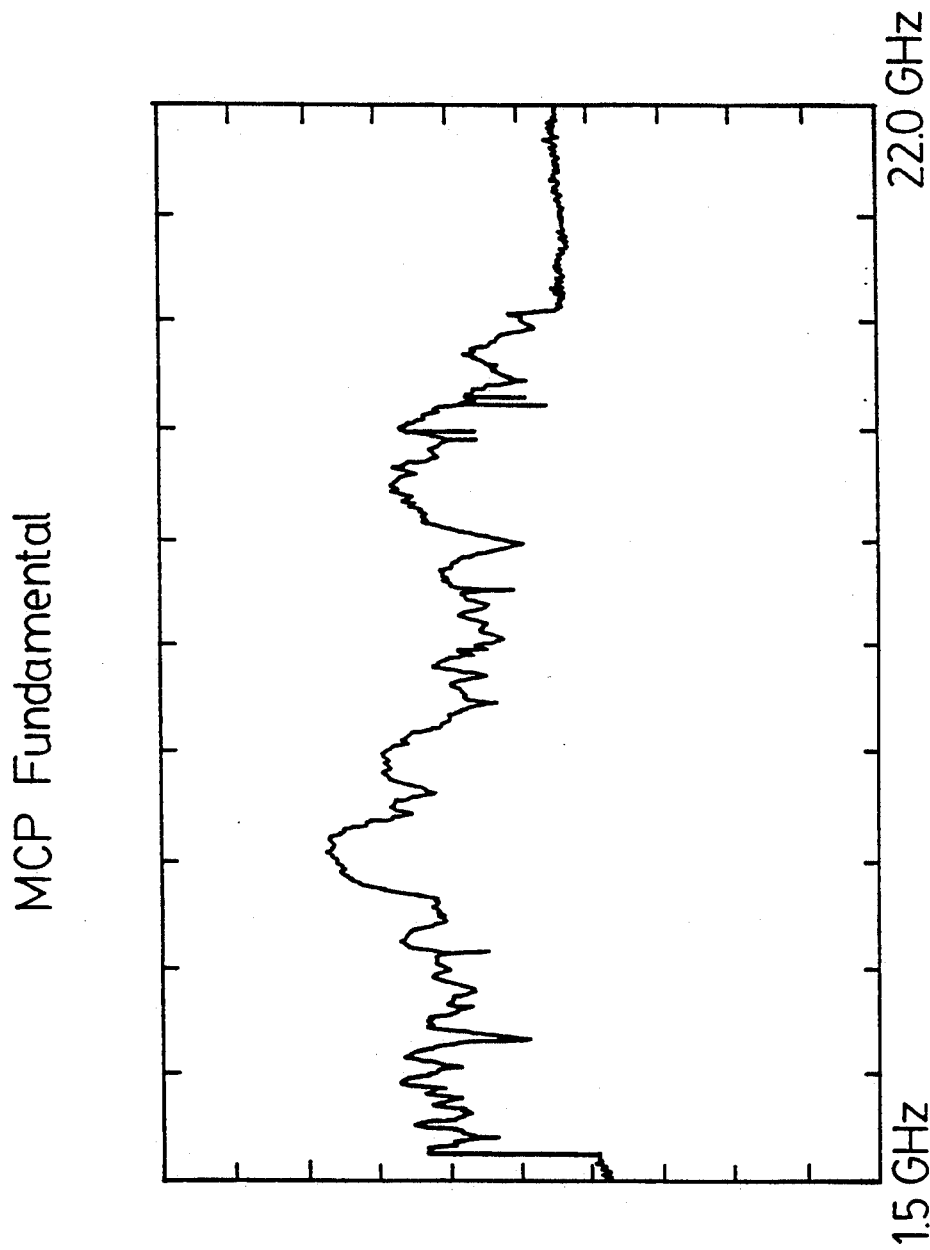
FIG._6.

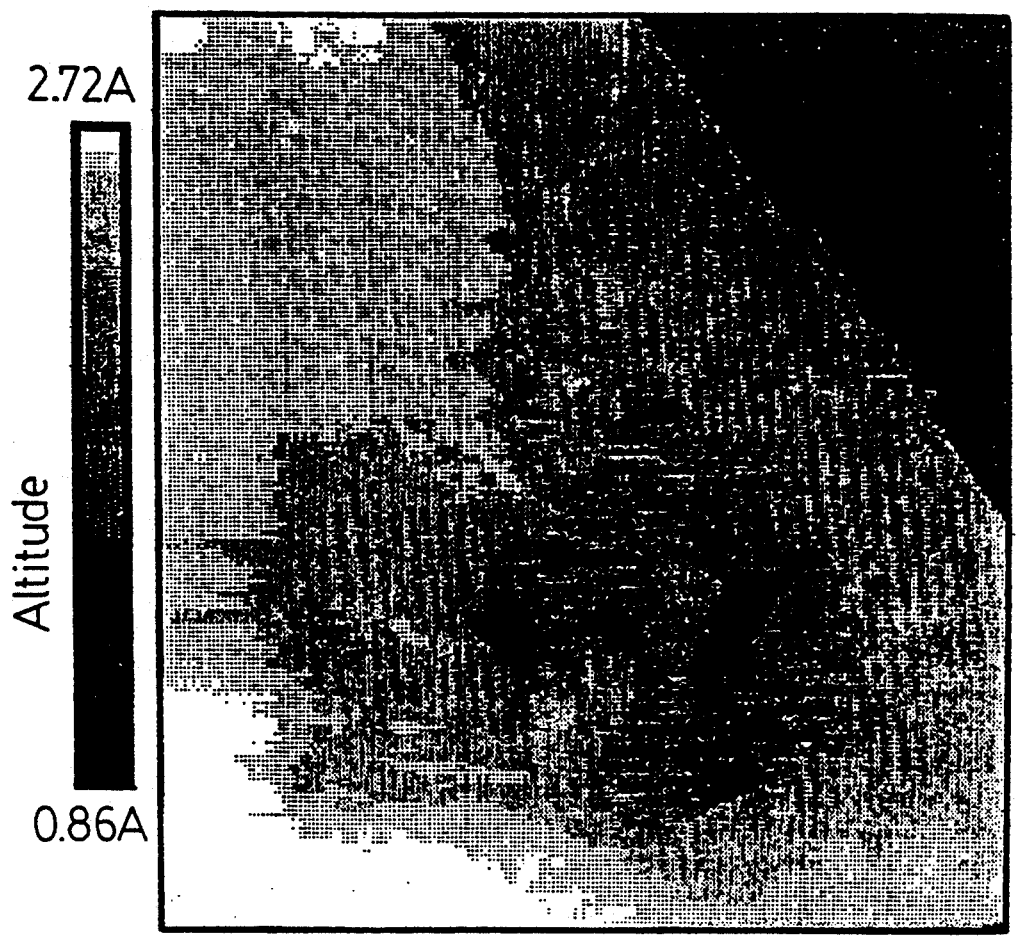
FIG._7

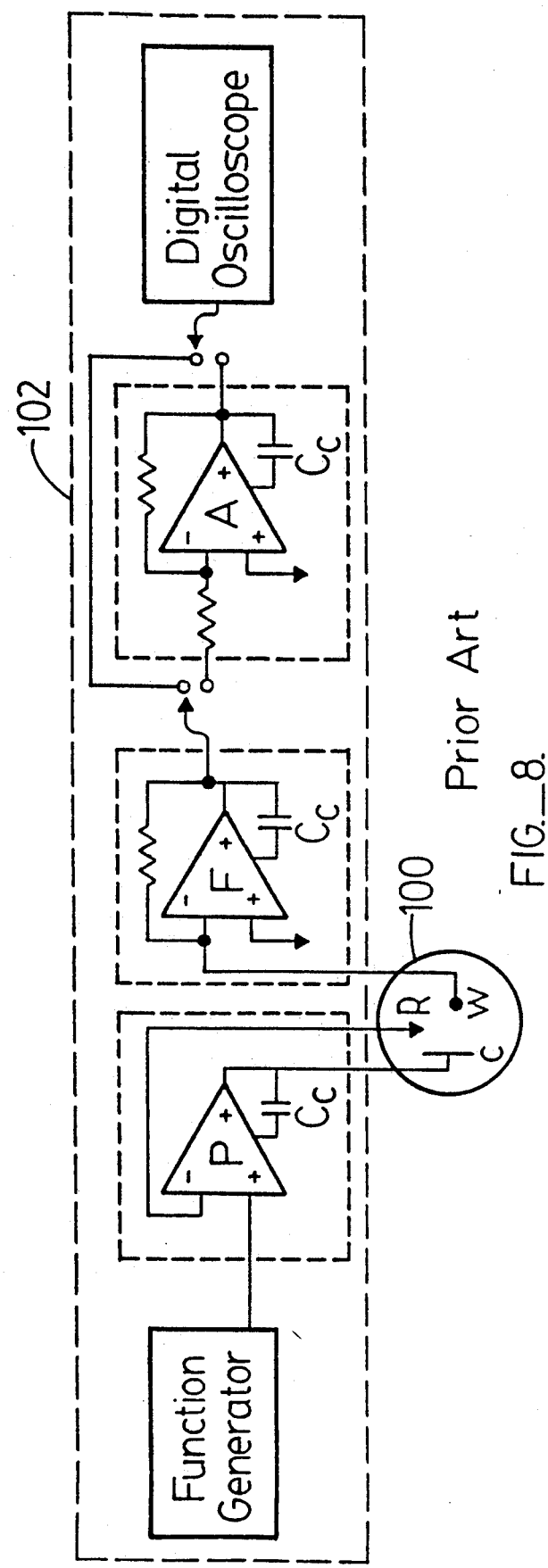
FIG._8. Prior Art

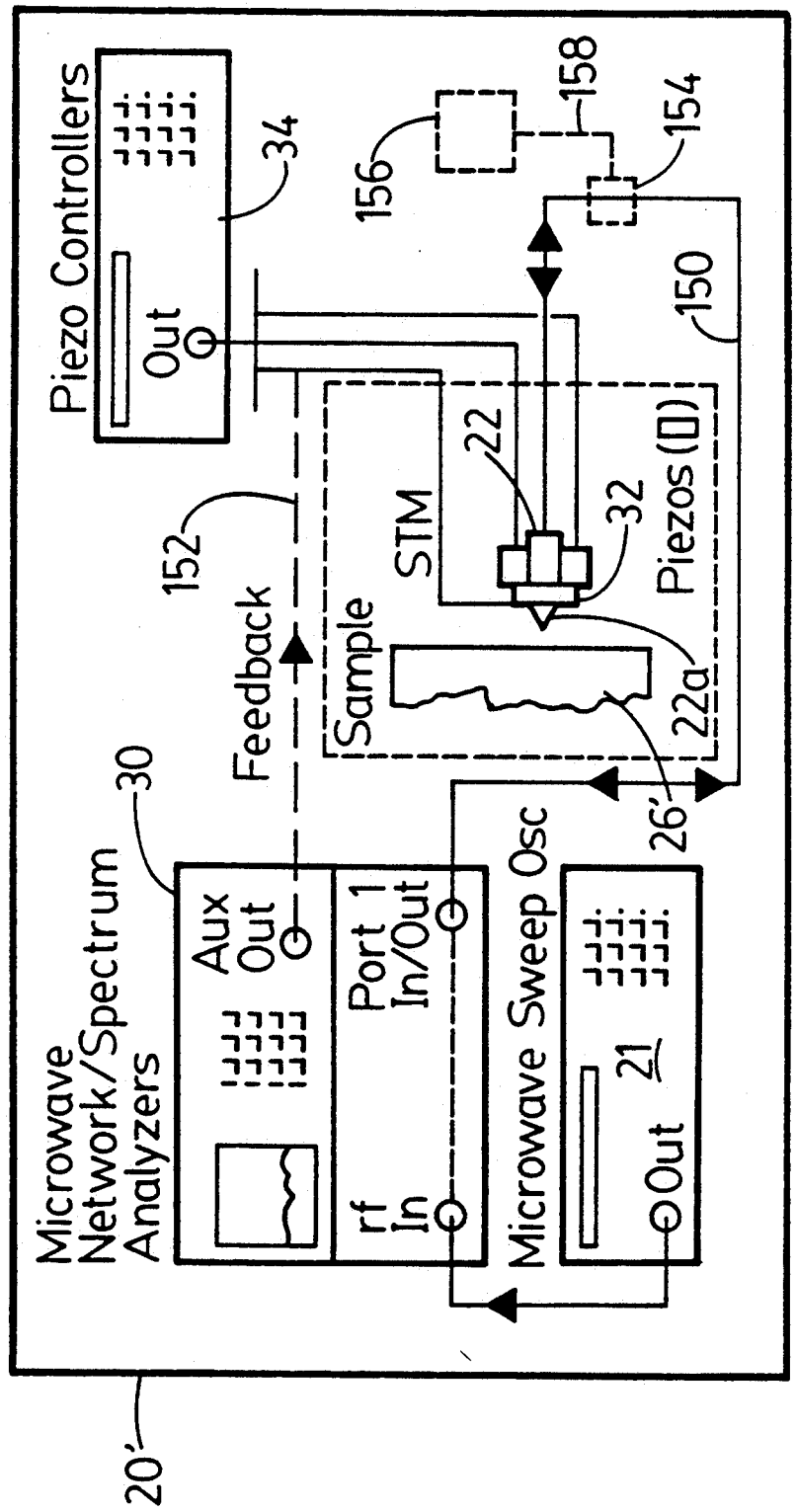
FIG._9.

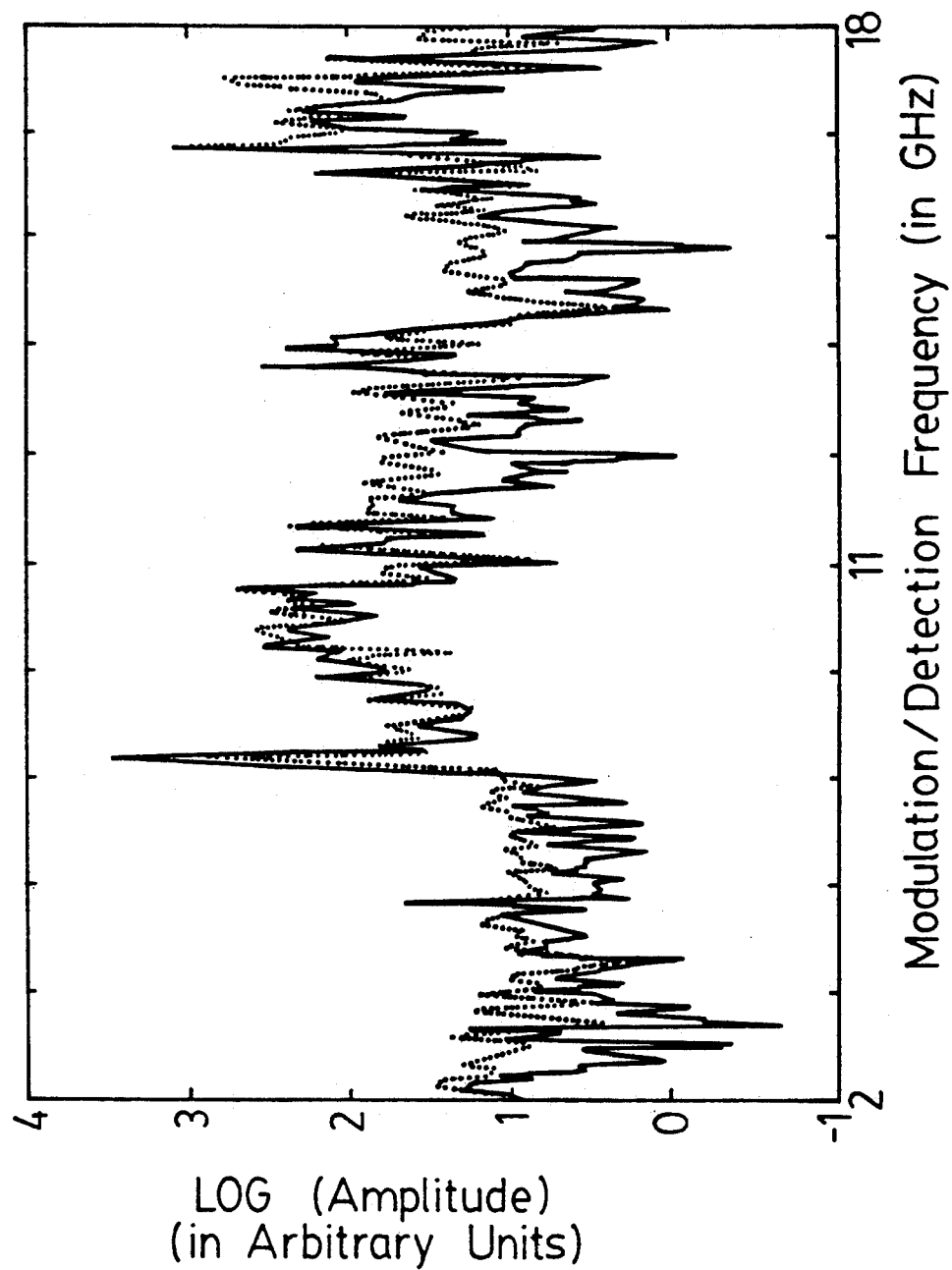
FIG._10.

SYSTEM FOR IMAGING AND DETECTING THRESHOLD PHENOMENA ASSOCIATED WITH AND/OR ATOMIC OR MOLECULAR SPECTRA OF A SUBSTANCE BY REFLECTION OF AN AC ELECTRICAL SIGNAL

This invention was made with support from the National Science Foundation, United States Government, under Grant No. CHE-9158375. The government has rights in this invention.

Cross-Reference to Related Application

This application is a continuation-in-part of Ser. No. 916,165 filed Jul. 17, 1992, hereinafter referred to as the "parent application," which is incorporated herein by reference in its entirety.

BACKGROUND OF THE INVENTION

This invention relates to a system for detecting the threshold and spectra of substances at the atomic or molecular level by detecting reflection of an alternating current (AC) electrical signal from the substances. This invention is particularly useful for imaging, and for measuring the threshold phenonema and spectra of bulk electrical insulators.

With the advent of instruments such as the scanning tunneling microscope (STM), it is now possible to investigate the structure, spectra and dynamics of biological molecules and membranes as well as other substances at the atomic or molecular level. While more than a thousand STM's have been in operation and the instrument has sparked great interest in spectroscopy, the actual headway that has been made in this area remains rather modest. Thus, Bob Wilson and co-workers at IBM Almaden have made some progress in distinguishing closely related adsorbed surface species in STM images. G. Meijer et al., Nature 348, 621 (1990). In "Non-Linear Alternating-Current Tunneling Microscopy," Kochanski, *Physical Review Letters*, 62:19, pp. 2285-2288 (May 1989), a method for scanning tunneling microscopy is described, where a non-linear alternating current (AC) technique is used that allows stable control of a microscope tip above insulating surfaces where direct current (DC) tunneling is not possible.

The STM has a sample to be investigated which functions as one electrode and another electrode in the shape of a microscope probe with a tip placed at a small distance away from the sample surface. A DC or a low frequency AC signal is then applied across the pair of electrodes. The probe tip is then moved across the sample surface in a scanning operation and the changes in the current or voltage across the electrodes are monitored to detect the characteristics of the sample.

The distance between the probe tip and the counter electrode/sample is controlled by a piezoelectric driver in one of two possible modes: a constant current mode and a constant height mode. The current or voltage detected between the pair of electrodes is used to derive a control signal for controlling the piezoelectric driver in the constant current mode to change the distance between the probe tip and the sample so as to maintain a constant current between the electrodes. The voltage that has applied to the piezoelectric driver in order to keep the tunneling current constant indicates the height of the tip z(x,y) as a function of the position (x,y) of the probe tip over the sample surface. A record of such voltages therefore indicates the topographical image of the sample surface. The constant current mode can be used for surfaces which are not necessarily flat on an atomic scale. A disadvantage of the constant current mode is the time required for the feedback loop for controlling the piezoelectric driver; this feedback action sets relatively low limits for the scan speed.

To increase the scan speed considerably, the feedback loop response is slowed or turned off completely so that the probe tip is rapidly scanned at a constant average distance to the counter electrode irrespective of the contours of the sample surface. The rapid variations in the tunneling current are recorded as a function of location (x,y) to yield the topographic information of the sample surface. This is known as the constant height mode referring to the fact that the probe tip is maintained at a constant distance from the counter electrode.

The constant height mode is advantageous over the constant current mode since it has a faster scan rate not limited by the response time of the feedback loop. Consequently, slow dynamic processes on surfaces can be studied. On the other hand, it is more difficult to extract the topographic height information from the variations of the tunneling current. Furthermore, unless the sample is atomically flat, the tip might crash into a surface protrusion of the sample. For a more complete description of the two operating modes of the STM's, please see "Scanning Tunneling Microscopy I," by H.-J. Güntherodt R. Wiesendanger (Eds.), Springer-Verlag, pp. 5-6.

In the article referenced above, Kochanski proposes to investigate insulating films by applying an AC current between the electrodes at frequency $\omega$ and the current between the electrode at $3\omega$ is detected. The AC signal is generated using a 2 GHz resonant cavity so that the frequency or frequencies of the signal applied to the STM electrodes and detected must be fixed in the scanning operation performed by Kochanski.

The parent application discloses a system using the ACSTM for detecting threshold phenomena associated with and/or atomic or molecular spectra of a substance, where the substance can be placed between the tip of the STM and a conductor where the tip is close to the conductor. This is not possible for measuring bulk insulators such as a silicon wafer or the living cells in a large organism such as an animal. It is therefore desirable to provide an alternative system which enables threshold phenomena associated with such substances to be measured.

SUMMARY OF THE INVENTION

One aspect of the invention is directed to an apparatus for detecting threshold phenomena associated with and/or atomic or molecular spectra of a substance. The apparatus comprises a source for providing an AC signal and an electrode spaced apart from the substance by a gap, said electrode coupling said input signal to the substance across said gap and detecting across said gap a reflected electrical signal from the substance in response to said input signal. The apparatus further comprises means connected to the electrode for measuring the amplitude of the reflected signal from the electrode to detect threshold phenomena associated with and/or atomic or molecular spectra of the substance. In the preferred embodiment, the measuring means measures the amplitudes of the reflected signal at the electrode over a predetermined spectrum of frequencies to detect threshold phenomena associated with and/or atomic or molecular spectra or electrochemical response of the substance. Also in the preferred embodiment, the reflected signal may be used for comparison with a reference signal to derive an error signal fed back to control the distance between the electrode and the substance in a constant current mode.

Another aspect of this invention is a method used for detecting threshold phenomena associated with and/or atomic or molecular spectra of a substance by means of an electrode. The method comprises placing the electrode near the substance so that the electrode is spaced apart from the substance by a gap, and providing an AC electrical input signal to the electrode, so that said input signal is coupled to said substance, said substance reflecting said input signal to generate a reflected signal. The method further comprises measuring the amplitude of the reflected signal at the electrode to detect threshold phenomena associated with and/or atomic or molecular spectra or electrochemical response of the substance. In the preferred embodiment, the measuring step measures the amplitudes of the current or voltage across the electrodes over a predetermined spectrum of frequencies to detect threshold phenomena associated with and/or atomic or molecular spectra of the substance. Also in the preferred embodiment, the method further comprises comparing the reflected signal with a reference signal to derive an error signal and using the error signal to control the distance between the electrode and the substance in a constant current mode.

The above aspects of the invention are based on the observation that threshold phenomena associated with and/or atomic or molecular spectra or electrochemical response of a substance such as a bulk insulator can be investigated by using an electrode to couple a current or voltage across a gap to the substance and detecting the reflected signal at the electrode. In this manner, it is unnecessary to measure the tunneling current which limits measurement to thin insulators or other small samples that can be placed on an electrical conductor. In the same manner as in the parent application, the reflected signal may be measured at the STM tip at frequencies over a predetermined spectrum of frequencies simultaneously instead of at only a single frequency as in Kochanski's work. Instead of detecting at different frequencies simultaneously, it is possible to detect at these frequencies sequentially as well.

Furthermore, in the preferred embodiment, if a tunable source (e.g., between about 1-30 GHz) is used for providing the AC signal applied across the electrodes, the frequency of the AC signal applied may be tuned to an optimal value for measuring the amplitudes of the reflected signal over the predetermined spectrum. In addition, by varying the frequency of the electrical signal, it is possible to detect rates of motion of charges, or structural rearrangements, in the sample or substance tested.

According to another aspect of the invention, the frequency of the AC signal is maintained substantially constant but the amplitude of the signal is varied and the reflected signal at a selected frequency is monitored so that a sudden change in current or voltage indicates a threshold of the substance. After the optimal frequency of the electrical signal to be applied is determined, the tunable source is preferably tuned to such frequency and the STM may then be used to scan a sample for differentiating different surface species or for obtaining images of the surfaces of the sample.

BRIEF DESCRIPTION OF THE DRAWINGS

FIG. 1 is a schematic diagram of a high frequency STM for imaging insulator surfaces using throughput attenuation with a network analyzer, or using non-linear harmonic recording with a spectrum analyzer to illustrate the invention of the parent application.

FIG. 2A is a graphical illustration of the modulated bias voltage used in the apparatus of FIG. 1 over time, where the dashed line shows the voltage threshold for a second electron to hop to (or from) the surface.

FIG. 2B is a graphical illustration of the resulting current due to the effect of the second electron versus time when the bias voltage of FIG. 2A is applied in the apparatus of FIG. 1.

FIG. 3 is a graphical illustration of the Fourier spectra detected when an AC signal is applied across a substance to be measured. The Fourier spectra includes three different graphs for three different substances having different thresholds.

FIG. 4 is a graphical illustration of the ratio of the current or voltage measured to the voltage or current applied to the STM electrodes across a predetermined spectrum when an AC signal of 2 GHz is applied across a substance.

FIG. 5 is a graphical illustration of the ratio of the current or voltage measured to the voltage or current applied to the STM electrodes across a predetermined spectrum when an AC signal of 2.5 GHz is applied across a substance.

FIG. 6 is a graphical illustration of the amplitudes of the current or voltage measured at the fundamental frequency of the signal applied to the STM electrodes across a substance.

FIG. 7 is a plot of the alternating current STM image of the edge of a pore on a surface showing the microscopic details of the surfaces scanned.

FIG. 8 is a schematic diagram of an electrochemical cell and a circuit diagram of a potential controlling and current measuring instrument for monitoring the electrochemical cell in a conventional arrangement.

FIG. 9 is a schematic diagram of a high frequency STM for imaging insulator surfaces by measuring the reflected signal with a network analyzer, or a spectrum analyzer to illustrate the invention of this application.

FIG. 10 is a graphical illustration of the ratio of the current or voltage of the reflected signal measured using the scheme of FIG. 9 at the fundamental frequency to the voltage or current applied to the STM electrode at the fundamental frequency. Shown in FIG. also is a graphical illustration of the ratio of the current or voltage of the signal transmitted through the same substance measured using the scheme of FIG. 1 at the fundamental frequency to the voltage or current applied to the STM electrodes at the fundamental frequency to electrodes across a substance, where the reflected and transmitted signals are measured simultaneously.

For simplicity in description, identical components are referred to in this application by the same numerals.

DETAILED DESCRIPTION OF THE PREFERRED EMBODIMENT

The description below referring to FIGS. 1 through 8 is taken from the parent application. FIG. 1 is a schematic diagram of a system 20 including a high frequency scanning tunneling microscope for imaging samples using throughput attenuation with a network analyzer, or using non-linear harmonic recording with a spectrum analyzer to illustrate the invention of the parent application. As shown in FIG. 1, a microwave sweep oscillator 21 generates an AC signal and applies it to microscope probe 22 with tip 22a through line 24. Tip 22a is placed close to but spaced apart (by vacuum, a gas or a fluid) from a sample 26 which is placed on top of the counter electrode 28. Tip 22a may be separated from sample 26 by a gap of atomic dimensions such as a fraction of one to a few Angstroms. Counter electrode 28 is connected to microwave spectrum/network analyzers 30. The position of the probe tip 22a over sample 26 is controlled by piezoelectric crystal 32 which is in turn controlled by piezo controllers 34. Controllers 34 receive from analyzers 30 a signal to be used for feedback.

In operation, the microwave sweep oscillator 21 applies the AC signal to tip 22a and analyzers 30 applies typically a reference voltage such as a virtual ground to counter electrode 28. The current or voltage between electrodes 22, 28 is monitored by analyzers 30 which derives a feedback signal for controlling controllers 34. In the constant current mode, this feedback signal is applied to the piezo controllers 34 for moving the tip 22a away from or towards the sample 26 in order to maintain a constant signal amplitude between electrodes 22, 28. In constant height mode, the distance between tip 22a and counter electrode 28 is maintained at a constant value and the feedback signal derived from the output of analyzers 30 is either not applied to controllers 34 or attenuated to a very low value before it is applied to controllers 34.

The scheme in reference to FIG. 1 differs from Kochanski's described above in that a tunable source is used to generate the AC signal applied across the electrodes and the amplitudes of the current or voltage can be measured simultaneously at frequencies within a predetermined spectrum using the analyzers. Analyzers 30 then compute the ratio between the amplitudes of the current or voltage measured to the amplitudes of the voltage or current applied by oscillator 21 to probe 22 at frequencies over a predetermined range or spectrum. Where the amplitudes are measured using a network analyzer, both the amplitudes and phases of current or voltage can be measured and used for imaging or spectroscopy.

When a voltage is applied across electrodes 22, 28, depending on the threshold of the substance in sample 26 at the position of the tip 22a and the distance between sample 26 and the tip 22a, electrons may tunnel between tip 22a and the sample. Such tunneling phenomena has been the subject of studies, one of which is set forth in the article "Single Electronics," by Likharey et al., Scientific American, pp. 80-85 (June 1992). As noted by Likharey et al., the application of a voltage across an insulating layer will cause a surface charge Q to build up across the barrier. When an electron tunnels through the insulating layer, the surface charge Q will change exactly by $+e$ or $-e$, depending on the direction of tunneling, where e is the electrical charge of a single electron. If the charge Q at the junction is greater than $+e/2$, an electron can tunnel through the junction in a particular direction, subtracting e from Q. The electron will tunnel in the opposite direction if the charge Q is less than $-e/2$. If Q is less than $+e/2$ and greater than $-e/2$, tunneling in any direction would increase the energy of this system. If the initial charge is within this range, tunneling would not occur and this suppression of tunneling is known as Coulomb blockade.

If the surface charge Q falls outside the range for Coulomb blockade so that electron tunnels through the insulating layer, which may cause the surface charge Q to fall within such range again. In such event, further tunneling is not possible. This is caused by the effect of the electric field exerted by the electron which has tunneled through on other electrons which may follow in its path.

The effect of applying a sinusoidal voltage across two electrodes separated by an insulating layer is shown in FIG. 2A. Thus, when the voltage applied exceeds a certain threshold 50 shown in dotted line in FIG. 2A, this causes the surface charge across the insulating layer to exceed the Coulomb blockade range. Thus, it is only during the time periods t1, t2, t3 that more than one electron per cycle will tunnel through the insulating layer to cause the current flow as shown in FIG. 2B.

The invention of the parent application is based on the observation that the threshold voltage of the substance in the sample can be determined by measuring the amplitudes of the current or voltage across electrodes over a predetermined frequency spectrum. Also, by inverse Fourier transform from the frequency domain to the time domain, graphs such as those in FIG. 2B can be obtained for determining the threshold of the substance in the sample. The Fourier spectra of three different substances with respective thresholds of 1 volt, 1 and 2 volts, and 2 volts are illustrated in FIG. 3. Thus, by performing an inverse Fourier transform of the three spectra, the respective thresholds of 1 volt, 1 and 2 volts, and 2 volts can be obtained. In this connection, FIG. 4 is a graphical illustration of a spectrum of a substance when a 2 GHz signal is applied by oscillator 20 across electrodes. FIG. 5 is a graphical illustration similar to that of FIG. 4 except that the oscillator applies an AC signal of 2.5 GHz instead of 2 GHz.

As illustrated in FIGS. 2A, 2B, when the amplitude of the AC signal applied across the electrodes is varied, such as where the amplitude is continually increased, one will see a sudden increase in the current flow between the electrodes when a threshold is reached. This will cause a sudden change in current and voltage across the electrodes which can be detected to indicate the presence of a threshold. This may be accomplished by comparing the amplitudes of the high harmonics to those of the low harmonics of the driving frequency of oscillator 21. When the frequency of the AC signal applied across the electrodes is gradually reduced, the surface charge buildup on one side of the insulating barrier caused by the tunneling electrons would tend to dissipate because of the mutual repulsion of the electrons. The dissipation rate of the electrons will reveal the rates of motion of charges in the substance, and the charge transport characteristics of the substance. When the frequency of the signal is varied, the amplitude of the signal is preferably kept substantially constant.

Oscillator 21 may be used to provide different frequency input AC signals across the electrodes. The amplitudes of the current or voltage across the electrodes may be measured as described above to obtain the spectra such as those shown in FIGS. 3-5 for different frequency input signals. Preferably, the amplitude of the signal provided in the above procedure remains substantially unchanged when the frequency of the signal provided by oscillator 21 is varied. From the various spectra obtained, an optimum value may be obtained for the frequency of the signal applied by oscillator 21, such as one which maximizes the signal detected. FIG. 6 illustrates such a feature. FIG. 6 shows the frequency response at the fundamental for tip 22a at the same spot of the sample. In other words, FIG. 6 is a plot of the ratio of the amplitude at the fundamental frequency of the current or voltage measured to the amplitude of the voltage or current applied to the electrodes, as the fundamental frequency of the signal applied by oscillator 21 is swept from 1.5 to 22 GHz. In other words, if the frequency response at the fundamental frequency is measured as the frequency of the applied signal sweep, the optimum frequency is indicated by the peak of the curve in FIG. 6 at about 7.7 GHz. This indicates that when the input signal is at such frequency, the signal recorded is maximum at the fundamental frequency. Obviously, the amplitudes at frequencies other than the fundamental may be used instead and are within the scope of the invention. FIG. 6 is obtained by sweeping the fundamental frequency supplied by the oscillator 21 under control of the analyzer 30, although this frequency can also be swept independently.

Once the optimum frequency is discovered, oscillator 21 may be tuned to such frequency and the STM is used in an otherwise conventional manner in either the constant current or constant height mode for differentiating surface species or for obtaining images of the surfaces of a substance or sample. By selecting particular frequencies which allow contrast between different surface species, the AC STM can be used to generate a map of the chemical species on the surface.

It is important to determine the spectral match (or lack thereof) between measurements of a known species and an unknown. The information may be used to determine the surface composition of one area versus another, or to intercompare an unknown with a previously characterised sample. Samples that can be visually intercompared with known spectra for identification purposes are the simplest case. If the differences are more subtle, a mathematical convolution of the known and unknown to highlight the differences assists the user to see the degree of agreement or lack thereof between the spectra. There are cases where the spectra are qualitatively very similar, or the signal to noise ratio is poor, or it is desired to to have a numerically based recognition of match. A statistical intercomparison of the spectra can be used to differentiate an unknown amongst a wide range of candidates. There are many approaches. Amongst them are the least square distance between spectra or a calculation of the eigenvector distance between spectra in n-dimensional space.

Since different molecules or particles will exhibit different spectra, it is possible to record the atomic or molecular spectra of a known substance to be a signature for comparison with atomic or molecular spectra of an unknown substance detected using the scheme above. The comparison will yield useful information on the composition of the unknown substance.

Any device that measures amplitude at one or more frequencies may be used to measure at a frequency (e.g. fundamental or a higher harmonic), or simultaneously at different frequencies across an entire spectrum. Such device may be a network analyzer or a spectrum analyzer.

FIG. 7 shows an image obtained of an edge of a pore on the surface using an STM employing the system of the invention. Since the invention functions at the atomic or molecular level, it is possible to detect and measure surface species and other local phenomena.

The concept of the invention of the parent application can be used not only for application to STM but also to other technologies including electrochemical applications.

The invention of the parent application is particularly useful for detecting fast electrochemistry. This is useful for analyzing electrochemically generated species before they diffuse away from the electrode at which they are generated and/or undergo subsequent reaction. It is also possible to analyze chemical species where the electrochemical environment is rapidly changing, such as in electrochemical probing of living cells. Fast electrochemistry can also be used to determine reaction rates and mechanisms. By using a very high modulation frequency, it is possible to measure extremely small numbers of molecules at very small electrodes by being able to measure a signal from each molecule present repeatedly as a form of signal amplification.

FIG. 8 is a schematic view of an electrochemical cell and a circuit of a potential controlling and current measuring instrument for monitoring the cell in a conventional arrangement taken from "Ultramicroelectrodes: Cyclic Voltammetry Above One Million V s$^{-1}$," by Andrieux et al., *J. Electroanal. Chem.*, 248:447–450 (1988). As shown in FIG. 8, electrochemical cell 100 is monitored by circuit 102 having counter electrode C, reference electrode R, and working electrode W. The scheme in FIG. 8 can be readily modified so that a concept of the invention of the parent application may be applied thereto. In reference to FIGS. 1 and 8, the working electrode W is connected to analyzers 30 in the same way as counter electrode 28 of FIG. 1. The output of oscillator 21 is applied to counter electrode C and reference electrode is connected to analyzers 30. Then the above-described operation for the STM may be adapted for measuring the fast electrochemistry of cell 100.

By using a very small working electrode, the capacitance of the bilayer (the molecules aligned at the electrode surface) is reduced, thereby reducing the associated RC time constant of the electrochemical cell 100 in order to increase the speed of the measurement. In reference to FIG. 8, a high frequency AC signal with or without a DC bias is applied to the counter electrode and the frequency spectrum at the current at the working electrode is sensed. The frequency spectrum obtained from such measurements will be determined by the current/voltage curves, since the current/voltage characteristics of the electrochemical cell are highly non-linear. Working at high frequency will outrun certain processes such as diffusion of electrochemically generated species away from the electrode. The DC bias can also be set to a feature of interest in the current/voltage characteristic of the electrochemical cell. Then by varying the modulation frequency, the rate of the electrochemical process can be monitored.

The invention of this application will now be described by reference to FIGS. 9 and 10 below as well as the description above taken from the parent application. FIG. 9 is a schematic diagram of a high frequency AC STM for imaging bulk insulator surfaces by measuring the reflected signal using the network analyzer, or using non-linear harmonic recording with a spectrum analyzer. As shown in FIG. 9, where the sample to be measured is a bulk insulator, such as a salt crystal or mineral or a living cell of an organism, it is not possible to measure the tunneling current or voltage in the manner described above. In such circumstances, the apparatus 20' of FIG. 9 will enable such substance to be measured.

In the same manner as described above, the sweep oscillator 21 supplies an AC signal to analyzer 30 which in turn supplies a microwave signal to sample 26' through tip 22a of the STM. This signal is transmitted from analyzer 30 to the STM through cable 150. Instead of detecting the tunneling signal transmitted from tip 22a to sample 26', which is not possible for a bulk insulator, the signal transmitted by tip 22a and reflected by sample 26', is detected instead at tip 22a, where such reflected signal is transmitted by cable 150 back to analyzer 30 at input/output port 1. Analyzer 30 records the reflected signal received at port 1. As indicated above, analyzer 30 is capable of recording the amplitudes at different frequencies over a predetermined spectrum of signals and therefore records the amplitudes at different frequencies within a predetermined spectrum of the reflected signal from cable 150.

FIG. 10 is a graphical illustration of the ratio of the current or voltage of the reflected signal measured using the scheme of FIG. 9 at the fundamental frequency to the input voltage or current applied to the STM electrode at the fundamental frequency. Analyzer 30 is of the type which can record both the reflected signal and the transmitted signal where the transmitted signal is recorded in the manner described above in reference to FIG. 1. Thus where both the transmitted and reflected signals are detected, as where the substance is thin or small or conductive, the transmitted signal may be detected by another electrode (not shown in FIG. 9 but similar to electrode 28 of FIG. 1) and sent to analyzer 30 to a port (not shown in FIG. 9) different from port 1. Shown also in FIG. 10 is a graphical illustration of the ratio of the current or voltage of the signal transmitted through the same substance as in FIG. 9, measured using the scheme of FIG. 1 at the fundamental frequency to the voltage or current applied to the STM electrodes at the fundamental frequency to electrodes across a substance where the reflected and transmitted signals are measured simultaneously. In FIG. 10, the reflected signal is plotted in solid lines whereas the transmitted signal is plotted in dotted lines. Thus, both the transmitted and reflected signals are measured when tip 22a of the STM is close to a sample 26'. This assumes that the sample 26' is not a bulk insulator so that the transmitted signal at electrode 28 of FIG. 1 can also be detected and measured and sent to analyzer 30.

As demonstrated in FIG. 10, it appears that the spectrum of sample 26' obtained by detecting the reflected signal is similar to the spectrum obtained by detecting the transmitted signal caused when electrons tunnel through sample 26'. This demonstrates that, when electrons are transmitted by tip 22a towards sample 26', the signal reflected by the sample 26' back towards tip 22a has similar signal characteristics as the signal 35 that is transmitted through the sample 26'. Hence, all of the above-described applications possible by detecting the transmitted signal caused by tunneling electrons are also possible where the reflected signal is detected instead of the transmitted signal. In addition, the reflected signal may be fed back through path 152 from analyzer 30 to controller 34 for controlling the distance between tip 22a and sample 26' in a constant current mode. Where such feedback path is turned off or severely attenuated, the STM is operating in constant height mode.

Where the analyzer 30 used is not suitable for detecting the reflected signal from cable 150 also used to transmit the input signal to the sample, a directional coupler 154 shown in dotted lines in FIG. 9 may be used to separate the reflected signal from the input signal from oscillator 21 on cable 150, and this reflected signal is sent to an appropriate device 156 also shown in dotted lines in FIG. 9 through line 158. Device 156 then detects and measures the reflected signal. Device 156 may be a spectrum analyzer, a network analyzer, a vector voltmeter, a power meter used with tunable filters, or any other device capable of measuring amplitude versus frequency.

Where the scheme of FIG. 9 is used for detecting electrochemical changes, the configuration of FIG. 8 needs to be modified only in the sense that the reflected signals detected from the working electrode W are measured instead of the transmitted signal from electrode C. Reference electrodes R may still be used for the electrochemical cell in this context. The reflected signal detected from the working electrode W may then be used in the same manner as that described above for the transmitted signal, for measuring various characteristics of the electrochemical change.

While the invention is described above in reference to various embodiments, it will be understood that various changes and modifications may be made without departing from the scope of the invention which is to be limited only by the appended claims.

What is claimed is:

1. An apparatus for detecting threshold phenomena associated with and/or atomic or molecular spectra of a substance, comprising:
   a source for providing an AC electrical input signal;
   an electrode spaced apart from the substance by a gap, said electrode coupling said input signal to a substance across said gap and detecting across said gap a reflected electrical signal from the substance in response to said input signal; and
   means connected to the electrode for measuring the amplitude of the reflected signal from the electrode to detect threshold phenomena associated with and/or atomic or molecular spectra or electrochemical response of the substance.

2. The apparatus of claim 1, said measuring means measuring the amplitudes of the reflected signal from the electrode over a predetermined spectrum of frequencies to detect threshold phenomena associated with and/or atomic or molecular spectra of the substance.

3. The apparatus of claim 2, said measuring means measuring substantially simultaneously frequencies of the reflected signal over said predetermined spectrum.

4. The apparatus of claim 1, wherein said source provides an electrical signal having frequencies above about 1 GHz.

5. The apparatus of claim 4, said source being tunable to any desired frequency within a predetermined range.

6. The apparatus of claim 1, wherein said source provides an electrical signal having frequencies in the range of about 1 to 30 GHz.

7. The apparatus of claim 1, wherein said source is tunable to provide a signal at different frequencies but of substantially the same amplitude.

8. The apparatus of claim 1, wherein said source is tunable to provide a signal of different amplitudes but at substantially the same frequency.

9. The apparatus of claim 1, wherein said measuring means is a spectrum analyzer, a network analyzer, a vector voltmeter, or a power meter with tunable filters.

10. The apparatus of claim 1, said electrode having a tip spaced apart by vacuum, a gas or fluid from the substance, said apparatus further comprising:
   feedback means for deriving an error signal from the reflected signal measured by the measuring means and the signal provided by the source; and
   means for moving the tip to change the distance between the tip and the substance in response to the error signal in order to reduce the error signal.

11. The apparatus of claim 1, further comprising means for storing atomic or molecular spectra of a known substance for comparison with atomic or molecular spectra of an unknown substance detected by the measuring means to detect the unknown substance.

12. The apparatus of claim 1, wherein said electrode and said measuring means are components of a scanning tunneling microscope adapted for scanning the substance to obtain an image of the substance.

13. A method for detecting threshold phenomena associated with and/or atomic or molecular spectra of a substance by means of an electrode, said method comprising:
   placing the electrode near the substance so that the electrode is spaced apart from the substance by a gap;
   providing an AC electrical input signal to the electrode, so that said input signal is coupled to said substance, said substance reflecting said input signal to generate a reflected signal; and
   measuring the amplitude of the reflected signal at the electrode to detect threshold phenomena associated with and/or atomic or molecular spectra or electrochemical response of the substance.

14. The method of claim 13, said measuring step measures substantially simlutaneously the amplitudes of the reflected signal at the electrode over a predetermined spectrum of frequencies to detect threshold phenomena associated with and/or atomic or molecular spectra of the substance.

15. The method of claim 13, further comprising repeating the signal providing step where the signals provided in the signal providing steps are of different frequencies, and repeating the measuring step at each of said different frequencies of the signal.

16. The method of claim 15, wherein the amplitude of the signal provided remains substantially unchanged when the signal providing step is repeated.

17. The method of claim 15, further comprising determining an optimal frequency of the signal for differentiating different surfaces species or for obtaining images of said surfaces.

18. The method of claim 17, wherein said providing step is performed using a tunable source of microwave AC signals, said method further comprising tuning the source to the optimal frequency before said providing step is repeated.

19. The method of claim 18, further comprising scanning the substance when said providing step is repeated in a constant current or constant height mode to obtain an image of the substance.

20. The method of claim 19, wherein said electrode has a tip and is a component of a scanning tunneling microscope adapted for scanning the substance to obtain an image of the substance, wherein said scanning step is performed by causing the tip of the electrode to scan the substance when said providing step is repeated.

21. The method of claim 15, wherein said providing and measuring steps are repeated where the frequency of the electrical signal provided in the providing steps is varied, in order to detect rates of motion of charges in the substance.

22. The method of claim 21, wherein the frequency of the electrical signal provided in the providing steps is continually reduced, said method further comprising comparing the amplitudes of high harmonics and those of low harmonics, when the frequency of the signal provided in the providing step is continually reduced.

23. The method of claim 13, further comprising repeating the signal providing step where the signals provided in the signal providing steps are of substantially the same frequency but different amplitudes, and repeating the measuring step at each of said different amplitudes of the signal.

24. The method of claim 23, wherein the signal providing step is repeated so that the amplitude of the signal is varied for each providing step compared to the previous providing step, said method further comprising detecting a sudden change in the reflected signal at the electrode when the amplitudes of the signal is varied to detect a threshold of the substance.

25. The method of claim 24, wherein the amplitude of the signal provided in the providing step is continually increased, said method further comprising comparing the amplitudes of high harmonics and those of low harmonics, when the amplitude of the signal provided in the providing step is continually increased.

26. An apparatus for detecting threshold phenomena associated with and/or atomic or molecular spectra of a substance, comprising:
   a tunable source for providing an AC electrical input signal at a selected frequency;
   an electrode spaced apart from the substance by a gap, said electrode coupling said input signal to a substance across said gap and detecting across said gap a reflected electrical signal from the substance in response to said input signal; and
   means connected to the electrode for measuring the amplitudes of the reflected signal at said selected frequency to detect threshold phenomena associated with and/or atomic or molecular spectra of the substance.

27. The apparatus of claim 26, wherein said measuring means is a spectrum analyzer, a network analyzer, a vector voltmeter, or a power meter with tunable filters.

* * * * *